(12) United States Patent
Pozder et al.

(10) Patent No.: US 10,643,912 B2
(45) Date of Patent: May 5, 2020

(54) CHIP PACKAGE INTERACTION (CPI) BACK-END-OF-LINE (BEOL) MONITORING STRUCTURE AND METHOD

(71) Applicant: GLOBALFOUNDRIES INC., Grand Cayman (KY)

(72) Inventors: Scott K. Pozder, Saratoga Springs, NY (US); Eng Chye Chua, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 137 days.

(21) Appl. No.: 15/657,312

(22) Filed: Jul. 24, 2017

(65) Prior Publication Data

US 2019/0027413 A1 Jan. 24, 2019

(51) Int. Cl.

| H01L 23/58 | (2006.01) |
|---|---|
| H01L 21/66 | (2006.01) |
| H01L 23/528 | (2006.01) |
| H01L 23/522 | (2006.01) |
| G01R 31/28 | (2006.01) |
| H01L 23/532 | (2006.01) |
| H01L 21/768 | (2006.01) |

(52) U.S. Cl.
CPC .......... *H01L 22/34* (2013.01); *G01R 31/2884* (2013.01); *H01L 21/76802* (2013.01); *H01L 21/76877* (2013.01); *H01L 23/522* (2013.01); *H01L 23/5226* (2013.01); *H01L 23/5283* (2013.01); *H01L 23/5286* (2013.01); *H01L 23/53295* (2013.01)

(58) Field of Classification Search
CPC . H01L 22/34; H01L 23/5226; H01L 23/5283; H01L 21/76802; H01L 21/76877; H01L 23/522; H01L 23/53295; G01R 31/2884
See application file for complete search history.

(56) References Cited

U.S. PATENT DOCUMENTS

| 6,781,151 B2 * | 8/2004 | Schultz | G01R 31/2884 257/207 |
|---|---|---|---|
| 7,749,778 B2 * | 7/2010 | Chanda | G01R 31/2858 257/48 |
| 7,955,955 B2 | 6/2011 | Lane et al. | |

(Continued)

OTHER PUBLICATIONS

TW Patent Application No. 107122087, Office Action dated May 17, 2019, 11 pages.

*Primary Examiner* — Shouxiang Hu
(74) *Attorney, Agent, or Firm* — Anthony Canale; Hoffman Warnick LLC

(57) ABSTRACT

Various embodiments include monitoring structures for integrated circuits (ICs) and related monitoring methods. In some cases, a monitoring structure includes: a set of serpentine-comb structures configured to connect with a back-end-of-line (BEOL) portion of the IC, each of the serpentine-comb structures including: a chain of interconnected laterally extending wires spanning a set of metal levels in the IC; and a set of vias connecting the chain of interconnected laterally extending wires across the set of metal levels, wherein the set of vias includes at least one via spanning between each successive level of the chain of interconnected laterally extending wires, wherein the chain of interconnected laterally extending wires and the set of vias are configured to detect a chip package interface (CPI) failure in the IC.

14 Claims, 8 Drawing Sheets

(56) References Cited

U.S. PATENT DOCUMENTS

| | | |
|---|---|---|
| 8,357,932 B2 * | 1/2013 | Matusiewicz ............. G03F 1/14 |
| | | 257/48 |
| 9,362,162 B2 | 6/2016 | Singh et al. |
| 2015/0221567 A1 * | 8/2015 | Chen ....................... H01L 22/14 |
| | | 257/48 |
| 2016/0049327 A1 | 2/2016 | Singh et al. |
| 2017/0011956 A1 | 1/2017 | De Wolf et al. |

* cited by examiner

CHIP PACKAGE INTERACTION (CPI) BACK-END-OF-LINE (BEOL) MONITORING STRUCTURE AND METHOD

BACKGROUND

The subject matter disclosed herein relates to integrated circuit devices. More particularly, the subject matter relates to monitoring structures in integrated circuit (IC) devices.

Low-k dielectrics, in particular porous low-k materials, are introduced in the back-end-of-line (BEOL) portion of an IC device to lower the k-value (the dielectric constant) and thereby minimize time delay in the interconnection of the circuitry. Sub-32 nm technology calls for ultra-low-k porous dielectric materials (e.g., k<2.5) for copper interconnects in the BEOL to reduce resistance-capacitor (RC) delay. However, although the k-value decreases with increasing porosity (as required to minimize RC delay), the mechanical strength of these materials is also reduced, making them susceptible to structural damage (e.g., cracks, delamination). Due to a mismatch in the coefficient of thermal expansion (CTE) of different materials, the packaging process can cause large shear forces to act on the chip at the BEOL portion, in particular, at the corners of the chip. These shear forces may lead to cracks in the BEOL portion. In addition, packaging technology such as micro-bumps, copper pillars, and through-silicon vias (TSVs) can introduce local stress in the BEOL portion. This local stress can also lead to damage of the weak low-k material underneath the BEOL. These problems are typically described as Chip Package Interaction (CPI). With thinning and stacking of chips for expanding three-dimensional (3D) technology, these problems can become even more acute. As such, in advanced technologies, additional mechanical forces can quickly lead to failure of the BEOL layers.

Monitoring and testing for CPI, particularly in the BEOL can be challenging. In particular, chip-to-chip variation and design-to-design variation have made conventional testing approaches ineffective at consistently identifying CPI in advanced technology ICs.

SUMMARY

Various embodiments include monitoring structures for integrated circuits (ICs) and related monitoring methods. In a first aspect of the disclosure, a monitoring structure includes: a set of serpentine-comb structures configured to connect with a back-end-of-line (BEOL) portion of the IC, each of the serpentine-comb structures including: a chain of interconnected laterally extending wires spanning a set of metal levels in the IC; and a set of vias connecting the chain of interconnected laterally extending wires across the set of metal levels, wherein the set of vias includes at least one via spanning between each successive level of the chain of interconnected laterally extending wires, wherein the chain of interconnected laterally extending wires and the set of vias are configured to detect a chip package interface (CPI) failure in the IC.

A second aspect of the disclosure includes a method of testing an integrated circuit (IC) for a chip package interface (CPI) failure, the method including: coupling a monitoring structure to the IC at a back-end-of-line (BEOL) portion of the IC, the monitoring structure having: a set of serpentine-comb structures configured to connect with the BEOL portion of the IC, each of the serpentine-comb structures including: a chain of interconnected laterally extending wires spanning a set of metal levels in the IC; and a set of vias connecting the chain of interconnected laterally extending wires across the set of metal levels, wherein the set of vias includes at least one via spanning between each successive level of the chain of interconnected laterally extending wires; initiating a test current through the IC and the monitoring structure; measuring the test current at the monitoring structure; and indicating the CPI failure is likely in response to the current measured at the monitoring structure deviating from an expected current at the monitoring structure.

A third aspect of the disclosure includes a monitoring structure for an integrated circuit (IC), the monitoring structure having: a plurality of serpentine-comb structures arranged in a grid, each of the serpentine-comb structures configured to connect with a back-end-of-line (BEOL) portion of the IC, wherein the grid is sized to contact distinct areas in the BEOL portion of the IC, each of the serpentine-comb structures including: a chain of interconnected laterally extending wires spanning a set of metal levels in the IC; and a set of vias connecting the chain of interconnected laterally extending wires across the set of metal levels, wherein the set of vias includes at least one via spanning between each successive level of the chain of interconnected laterally extending wires, wherein the set of vias includes two vias between each of the successive levels of the chain of interconnected laterally extending wires, wherein the interconnected laterally extending wires span an entirety of the set of metal levels in the IC, wherein the chain of interconnected laterally extending wires and the set of vias are configured to detect a chip package interface (CPI) failure in the IC.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
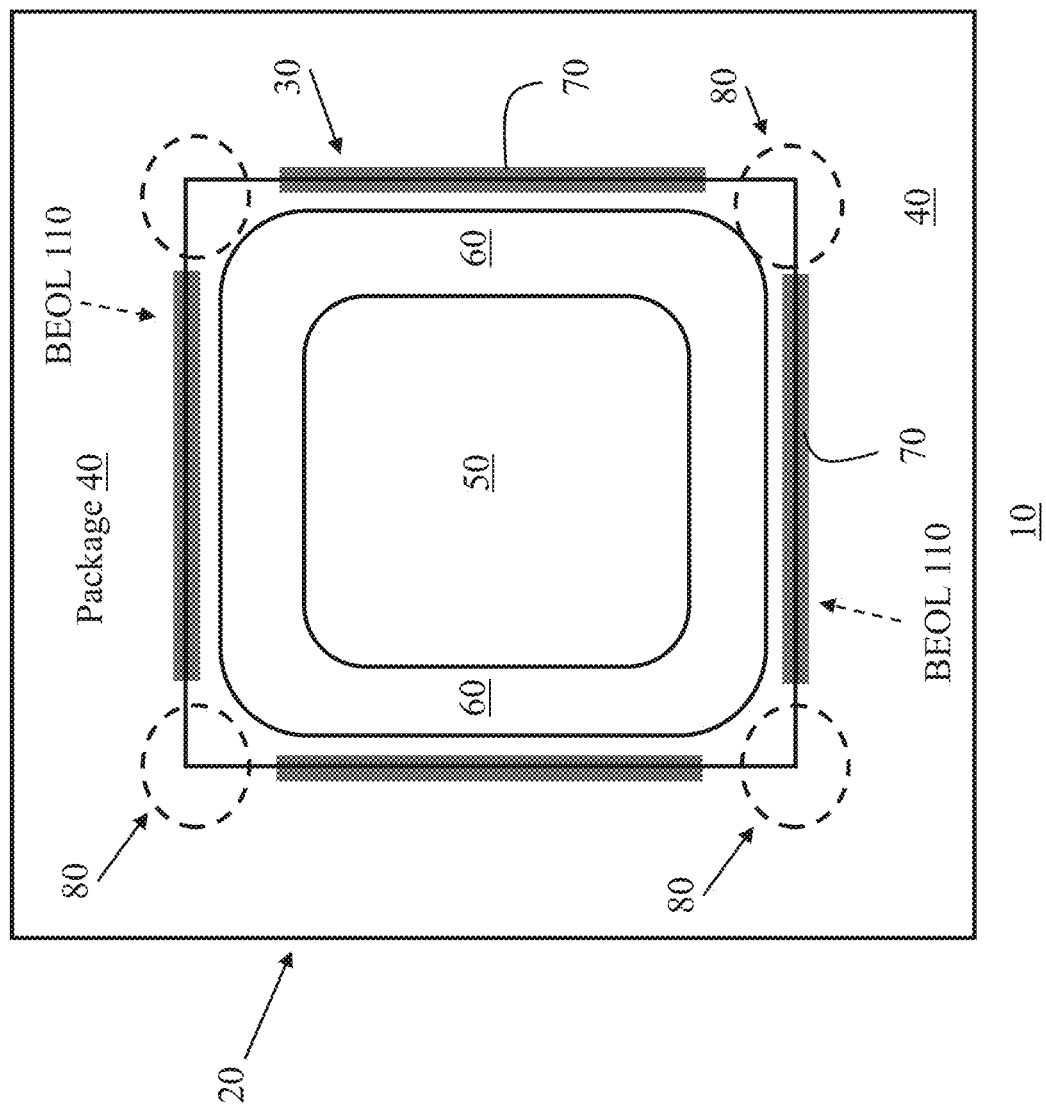
FIG. 1 shows a CPI risk map of an integrated circuit (IC) device, in plan view.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits (ICs). More particularly, the subject matter relates to chip package interface (CPI) monitoring structures in integrated circuit (IC) devices.

In the following description, reference is made to the accompanying drawings that form a part thereof, and in which specific embodiments are shown by way of illustration. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), molecular layer deposition, evaporation.

As described herein, as IC technology has advanced it is becoming ever more difficult to test IC devices to determine whether one or more particular modes of failure are likely to occur during operation. Various aspects of the disclosure include a monitoring (or, testing) structure for determining the impact of packaging on an IC chip, with particular focus on CPI. The monitoring structure can be fabricated in the BEOL design of the IC chip, or may be bonded to one or more portions of the IC chip (e.g., at the back-end-of-line, or BEOL). In the case that the monitoring stricture is bonded to a portion of the IC chip, it may be bonded to a micro-electro-mechanical-system (MEM) or an interposer, or may be stacked in a three-dimensional (3D) circuit package. In any case, the monitoring structure is tested to determine a likelihood of a CPI failure. In various embodiments, the test is performed at wafer level, e.g., as a BEOL stability indentation (BABSI) test. As is known in the art, the BEOL portion or BEOL of an IC, is the portion of the wafer (e.g., semiconductor wafer) formed following the first metallization, e.g., when individual devices such as transistors, capacitors, resistors, etc. are interconnected with wiring on the wafer (or, the first metallization layer).

In particular cases, the monitoring structure can include a chain of interconnected serpentine-combs and via structures configured to test an IC for CPI. The monitoring structure is connected with the IC at the BEOL to perform CPI testing. In some cases, the monitoring structure can be connected with a bump on the IC packaging, an underfill material and/or directly bonded to an oxide layer on the IC. The monitoring structure is bonded to the IC and a CPI test is run to determine whether that IC is likely to fail one or more CPI criteria when final packaging is applied.

FIG. 1 shows a CPI risk map 10 of an integrated circuit (IC) device 20 (in plan view). As shown, IC device 20 can include conventional IC components such as a die 30 and a package 40 coupled with die 30 at a BEOL portion 110. Die 30 is shown as including an interior region 50, periphery 60 surrounding the interior region 50, and sides 70 along the periphery 60. Die 30 rests on package 40 (at BEOL portion 110, described further herein) and is coupled with the package 40 along the obstructed surface of die 30. Die 30 is coupled with package 40 in several of the regions shown (e.g., interior region 50, periphery 60, sides 70), along with corners 80 between adjacent sides 70 of die 30.

Die 30 can include one or more of a plurality of conventional integrated circuit (IC) chips (not shown) coupled with package 40. These conventional components are described herein for illustrative purposes, but it is understood that any conventional components within a die can be included in die 30, and may not be illustrated herein. In some cases, IC chips can include memory devices, logic devices, capacitors or any other conventional IC chip structure. IC chips can further include a plurality of connectors (not shown) for providing electrical connection between IC chips and other devices, and/or between IC chips. In various embodiments, connectors include a set of copper pillars or one or more copper vias. However, it is understood that connectors may include any other known connector device. In some cases, a thermally conductive material (not individually shown) is placed between die 30 and package 40. In some cases, this thermally conductive material can couple one or more chips in the die 20 with package 40, e.g., as an adhesive, and can include solder or a thermally conductive gel. In some cases, package 40 can further include one or more epoxies, silicones, urethanes, acrylates, etc., with thermally conductive fillers (e.g., silver, diamond, aluminum nitride, boron nitride, zinc oxide, etc.). In still further embodiments, package 40 can include solder, indium, thermal greases and/or thermally conductive pads, which may contact IC chip(s) on die 30. In various embodiments, a dielectric layer (not shown) is located between IC chip(s) on the die 30 and the package 40. In some cases, this dielectric layer fills gaps between IC chips and package 40, and between IC chips. This dielectric layer can include an inorganic passivation material such as thermal barrier oxide (TBO) silicon oxide or silicon nitride and/or an organic material such as polyimide (PI), polybenzoxazole (PBO), benzocyclobutene (BCB), Phenolic resin, olefin or conventional epoxy molding compound. However, in some cases, the dielectric layer can be completely free of epoxy. A redistribution layer (RDL) (not shown) may also be used, including a plurality of fan-out vias, to connect die 30 and package 40. RDL can further include an insulator, such as an organic dielectric or a photosensitive material. Additionally, one or more solder balls or other solder contacts (e.g., pillars) (not shown) can be coupled with the RDL to connect vias on die 30 with package 40.

Package 40 can include any conventional packaging device, such as a carrier, for coupling with die 30. In various embodiments, IC device (or simply, IC) 20 is shown in a particular orientation (with die 30 overlying package 40), however, it is understood that IC 20 can be oriented in any number of manners, and reference to terms such as above, below, upper, lower, etc. is merely for facilitating explanation of the FIGURES, and not limiting of the disclosure. In various embodiments, package 40 is formed of a metal such as copper or aluminum. In some cases, package 40 is formed entirely (or substantially entirely, permitting nominal impurities) of the metal, e.g., copper (Ni plated copper), or aluminum. In other embodiments, package 40 is formed entirely (or substantially entirely, permitting nominal impurities) of one or more of CuW, SiC, CuSiC, AlSiC, AlN, diamond, graphite, silicon or composite materials. Package 40 may also include other contacts for coupling with external devices, as is known in the art.

It is understood that the aspects of IC device 20 described herein are used merely as examples of IC device configurations which may benefit from various aspects of the disclosure. That is, the particular features of IC device 20 are not intended to be limiting of the monitoring devices and methods according to various aspects of the disclosure.

The CPI risk map 10 highlights some of the regions of IC device 20 where CPI is a concern. For example, at corners 80, package 40 and die 30 can be susceptible to BEOL cracking, underfill cracking, ultra-low-k (ULK) dielectric strain (causing failures) and bend cycling (causing fatigue failures). At periphery 60 of die 30, CPI risk can include strain and strain energy density gradients in the ULK dielectric, as well as strain at hump-die connections, and strain in the tetra-ethyl-ortho-silane (TEOS) layer of the BEOL. At sides 70 of die 30, cracking risk can be significant, particularly in the grooved/diced edges. Further, corrosion-driven delamination and/or die size loading (leading to cracking) can cause other CPI failures in the side 70/package 40 interface. Further, at interior region 50 of die 30, local strains due to some coreless packaging designs (e.g., embedded trace substrates, or ETS) can decrease rigidity when compared with a cored package. This CPI risk map 10 is merely intended to outline some of the CPI-related risk in IC packaging, and is meant only as an illustrative example. It is understood that additional and/or ether risks/failures in IC packaging could be aided by the structures and methods disclosed according to various embodiments herein.

Figure 2:
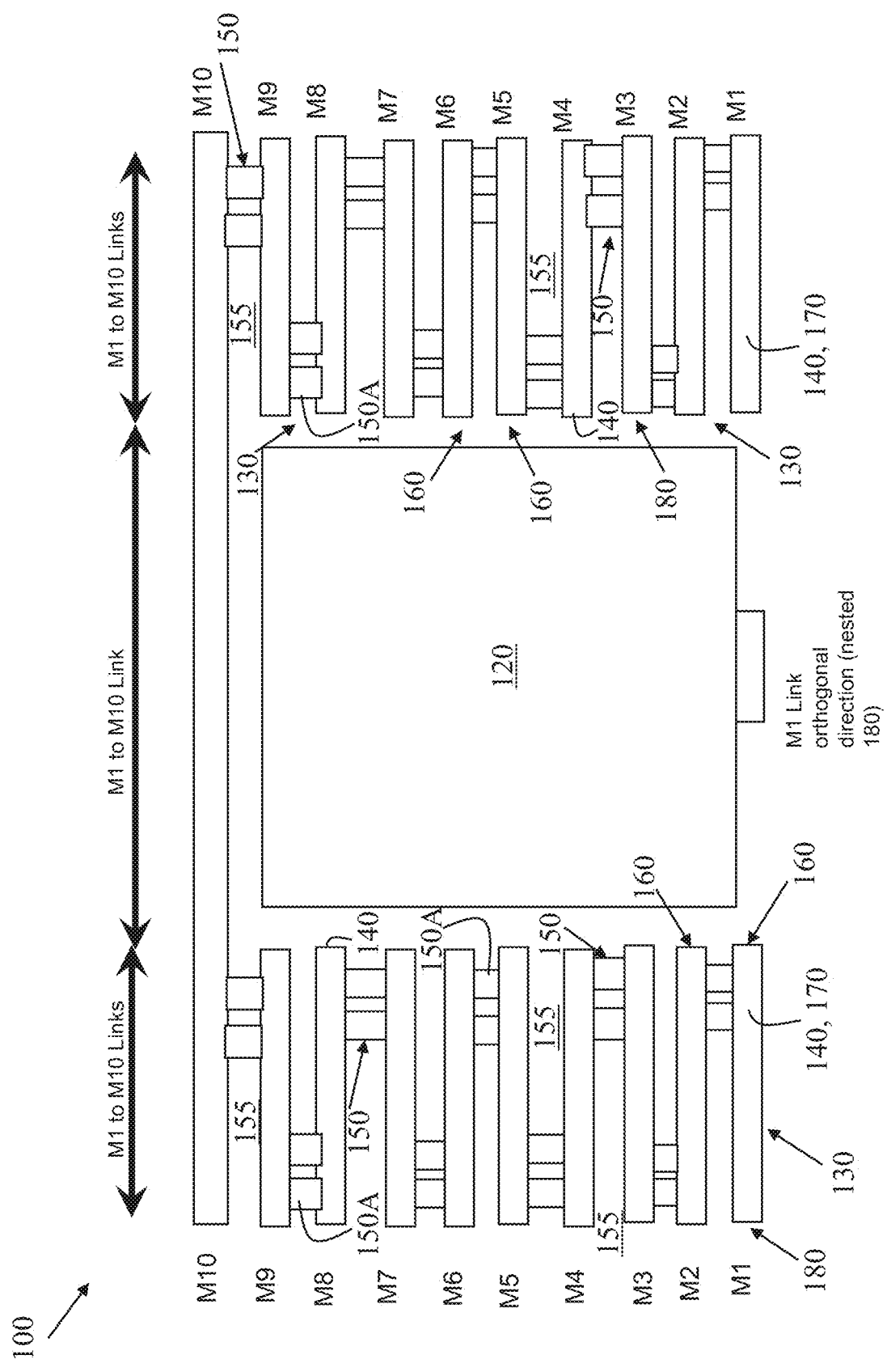
FIG. 2 shows a schematic close-up cross-sectional depiction of a monitoring structure for an IC according to embodiments of the disclosure.

FIG. 2 shows a schematic close-up cross-sectional depiction of a monitoring structure 100 for an IC (e.g., IC device 20) or according to various embodiments. As will be described herein, monitoring structure 100 can be one of a set of monitoring structures (e.g., two or more) arranged in a grid to monitor a plurality of components in an IC. Monitoring structure 100 can be configured to mount to a portion of an IC, e.g., the die 30 (FIG. 1) to test that IC for potential CPI failures. That is, in various embodiments, monitoring structure 100 can be coupled with die 30 portion of an IC 20 at a BEOL portion 110 (FIG. 6) of IC or at one or more circuit structures 120 with connections at BEOL portion 110 of the IC (FIG. 1). FIG. 2 shows a section of monitoring structure 100 in conjunction with circuit structure 120. Circuit structure 120 is shown generically as a block to illustrate that circuit structure 120 can include any conventional functional circuit component such as a transistor, resistor, contact, etc. In other cases, circuit structure 120 can include MEMs mechanical components such as pressure sensing membranes, cantilevers, or elements used in accelerometers, strain gauges, gyroscopes, etc.

Figure 3:
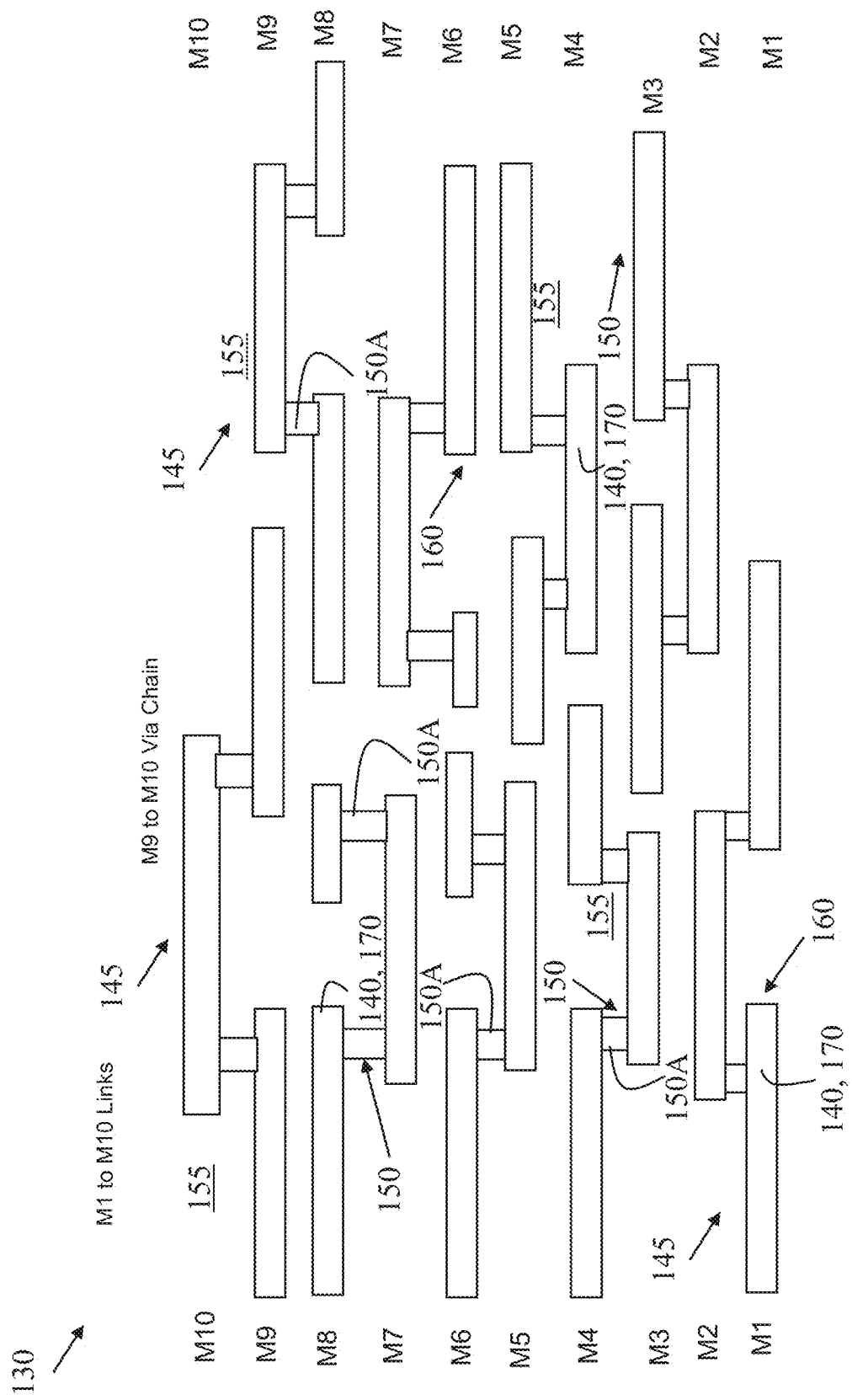
FIG. 3 shows a schematic close-up cross-sectional depiction of a portion of the monitoring structure of FIG. 2.
Figure 6:
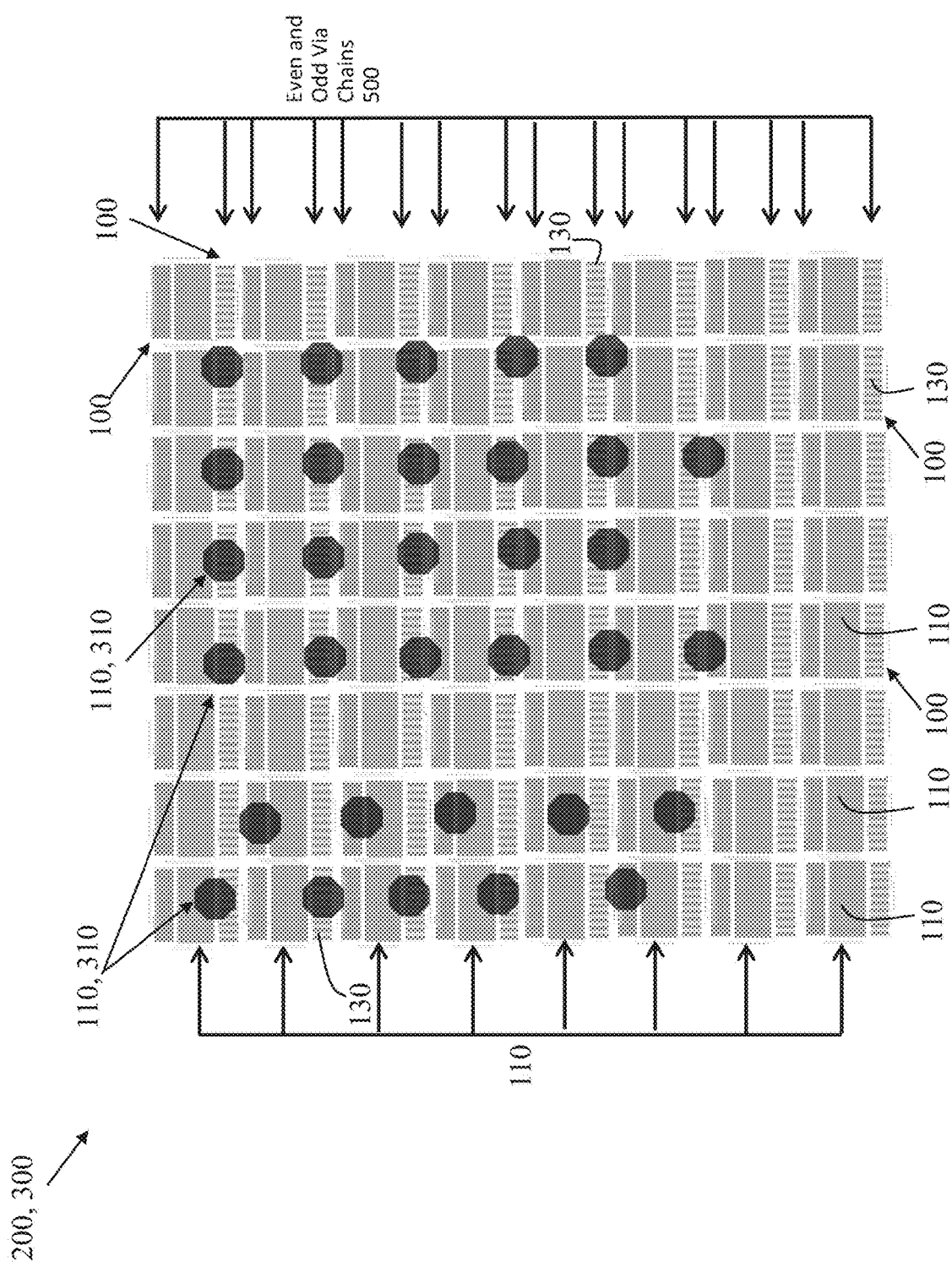
FIG. 6 shows an additional schematic cross-sectional view of a grid of monitoring structures interacting with overlying bump features according to various embodiments of the disclosure.

In various embodiments, monitoring structure 100 is coupled with a BEOL portion 110 (FIG. 6) of IC 20 (FIG. 1) to test the IC for potential CPI failures. In particular embodiments, monitoring structure 100 includes a set of serpentine-comb/via chain structures 130 configured to connect (electrically connect) BEOL portion 110 (FIG. 6). Each serpentine-comb/via chain structure 130 can include a chain of interconnected laterally extending wires 140 spanning a set of metal levels (M1, M2, M3, C4, C5, etc.) in the IC, and a set of vias 150 connecting the chain of laterally extending wires across the set of metal levels (M1, M2, M3, C4, C5, etc.), wherein the set of vias 150 includes at least one via 150A spanning between each successive level 160 of the chain of laterally extending wires 140. FIG. 3 shows a schematic cross-sectional depiction through the serpentine-comb structure 130 of FIG. 2, illustrating the interconnected chain of vias 150 for connecting metal levels (M1, M2, M3, etc.). As shown in FIG. 3, the interconnected chain of vias 150 can include a wire 140 on each of a plurality of metal levels (e.g., M1, M2, M3), with a via 150 connecting each wire 140 to a distinct wire 140 on a distinct one of the metal levels (e.g., M1, M2, M3). In various embodiments, a via chain 145, including a pair of vias 150 and three lines 140, is used as a CPI detection device. That is, these via chains 145 include independent sets of lines 140 at two distinct metal levels (M1, M2, M3, etc.) for detecting potential CPI failures, such that a break in one via chain 145 (e.g., at via(s) 150 between M6 and M7, does not interrupt the chains 145 that span between M7-M8 or M5-M6. This allows for precise identification of failure locations using the separate via chains 145.

As described further herein, the via chains 145, which include a chain of laterally extending wires 140 and the set of vias 150 are configured to detect a CPI failure in the IC, e.g., cracking in the dielectric layer 155 between wires 140 and vias 150. In particular cases, the chain of laterally extending wires 140 includes a set of substantially parallel lines 170 forming the successive levels 160 of chain (of wires) 140, where the at least one via 150A between each of the substantially parallel lines 170 is located proximate an opposite end 180 of the laterally extending wire 140 relative to the at least one via 150A between an adjacent level 160 of the successive levels 160. That is, in various embodiments, the chain 140 includes sets of vias 150 between neighboring (immediately adjacent) parallel lines 170 which are located proximate alternating ends 180 of lines 170 from level 160 to immediately adjacent level 160 (FIG. 2). This via 150 and line 170 pattern creates the serpentine-comb/via chain structure 130.

In some cases, as shown in the example configuration of FIG. 2, each set of vias 150 can include two distinct vias 150A between each of successive levels 160 of the chain of wires 140. In some embodiments, multiple vias (e.g., two distinct vias 150A) are used to decrease the electrical resistance of each connection. This configuration can make the resistance of the series of connections lower, when compared with a single via 150. In some particular embodiments, the interconnected laterally extending chain of wires 140 spans an entirety of the set of metal levels (e.g., M1 to G1) in the IC. In this case, monitoring structure 100 can be used to effectively test each of the metal levels (e.g., M1 to G1) in the IC for a potential CPI failure, e.g., a crack or delamination in the dielectric 155, as evidenced from a deviation in measured current through monitoring structure 100 from an expected current reading. As noted herein, FIG. 3 illustrates how the via chains 145 can aid in detecting failures at specific levels (e.g., M1, M2, etc.) without disrupting other chains 145.

It is further understood that the accordion-style design of monitoring structure 100 can be designed to flex when pulled or compressed. As such, monitoring structure 100 is less likely to contribute to cracking and/or delamination in dielectric when force is applied to the monitoring structure 100. In some embodiments, the alignment of vias 150 in the serpentine-comb/via chain structures 130 can be modified in order to concentrate loading for particular sensitivities, e.g., when a lower dielectric-constant level dielectric (e.g., dielectric 155) is present. Via configurations can be tailored to account for dielectric constants across various distinct ICs 20 in order to avoid inaccurate readings of potential CPI failures.

In various embodiments, the interconnected laterally extending wires 140 are configured to be bonded to the BEOL portion 110 of the IC (e.g., at die/package interface (FIG. 1)), e.g., via conventional solder connection. For example, in some cases, BEOL portion 110 includes at least one of a connector bump on the IC, and underfill material (not shown) on the IC 20 or an oxide layer on the IC 20. In the example embodiment of monitoring structure 100 show in FIG. 2, circuit structure 120, wires 140 and vias 150, 150A can be formed simultaneously in a sequential process, whereby each level 160 is formed to build a stack of serpentine-comb structures 130.

Figure 4:
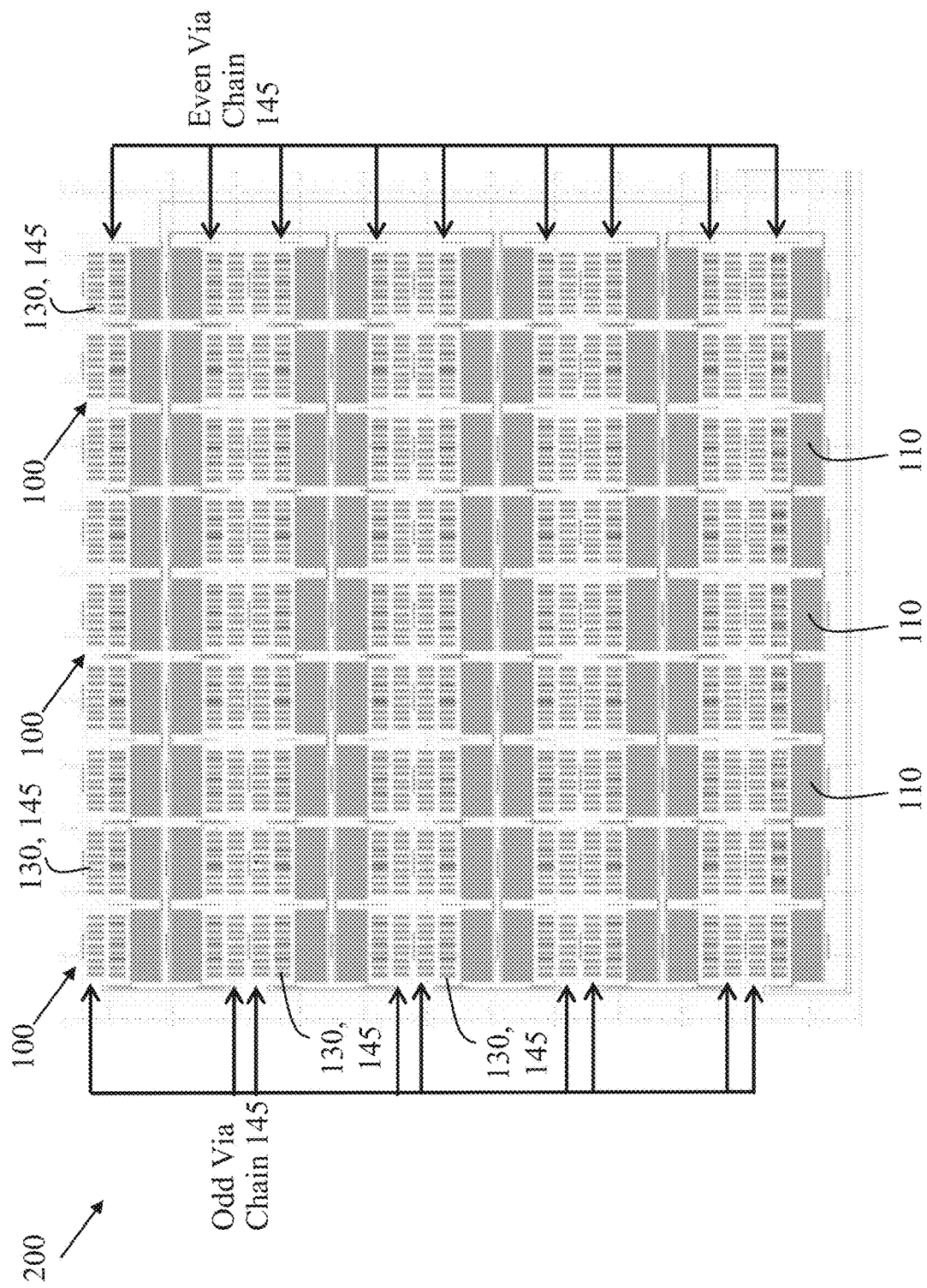
FIG. 4 shows a schematic cross-sectional view of a grid of monitoring structures according to embodiments of the disclosure.

In some cases, as shown in the schematic cross-sectional depiction of FIG. 4, the set of serpentine-comb/via chain structures 130, 145 can include a plurality of serpentine-comb structures 130 and via chains 145 arranged in a grid 200. Grid 200 can be sized to contact distinct areas in the BEOL portion 110 of the IC for CPI testing, e.g., distinct circuit structures 120 in the BEOL portion 110 of the IC (FIG. 6). In some cases, grid 200 can be positioned in a particular region of BEOL portion 110, such as corner(s) 80 or other regions where CPI failure is likely. In other embodiments, grid 200 can be sized to couple with approximately the entire BEOL portion 110 to provide a comprehensive CPI test. According to various embodiments, each of the serpentine-comb/via chain structures 130, 145 is configured to detect a CPI failure in the IC during a wafer-level test of that IC, e.g., a BEOL stability indentation (BABSI) test. As described herein, the CPI failure can be detected in response to a current flowing through the serpentine-comb/via chain structure 130, 145 deviating from an expected current.

In the example grid 200 shown in FIG. 4, it is understood that various connection configurations could be utilized to test the IC for potential CPI failures. For example, in some cases, a plurality of monitoring structures 100 are connected with distinct circuit structures such as BEOL portions 110 in alternating even/odd via chains 500 (FIG. 6). In this example, odd via chains 145 are shown as coupled on the left-hand side of grid 200, while even via chains 145 are shown as coupled on the right-hand side of grid 200.

Figure 5:
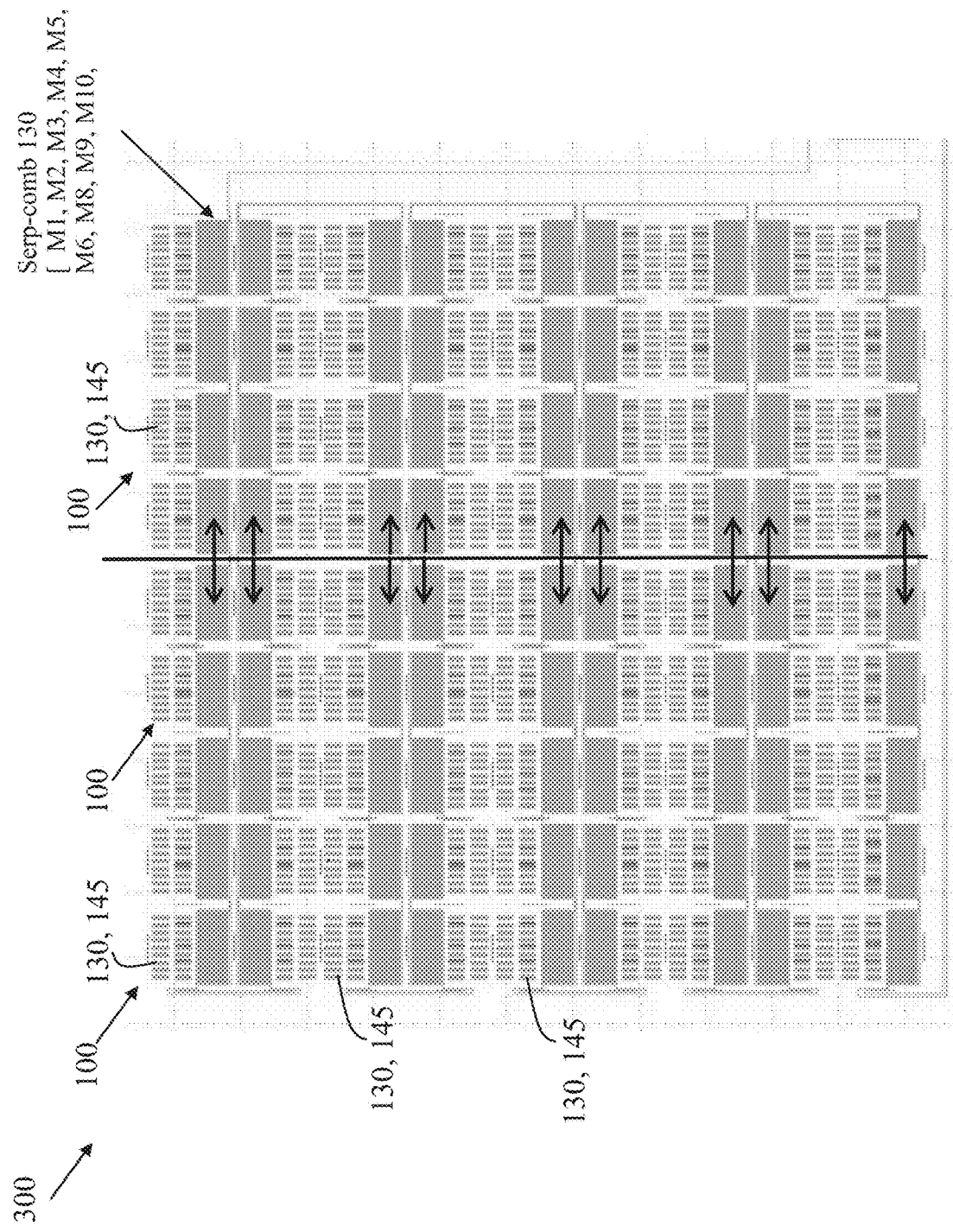
FIG. 5 shows a schematic cross-sectional view of a grid of monitoring structures according to further embodiments of the disclosure.

In another example configuration, shown in FIG. 5, a grid 300 of monitoring structures 100 present in a single metal level of the BEOL 110 is shown. In this view, monitoring structures 100 are located below overlying levels of the BEOL 110, which can include metal interconnect layers, bump pad layers, final passivation layers, under bump pads and bumps. In various embodiments, as shown in the schematic depiction in FIG. 6, bump features (e.g., controlled collapse chip connections (C4s), hump pads, etc.) 310 are shown in outline form (demonstrating example locations), as distributed in an array over a grid (e.g., grid 200 or grid 300). As is known in the art, the bump features 310 can attach to an IC package. According to various embodiments, where the CTE (coefficient of thermal expansion) mismatch between the package and the chip is coupled mechanically to structures 100.

Figure 7:
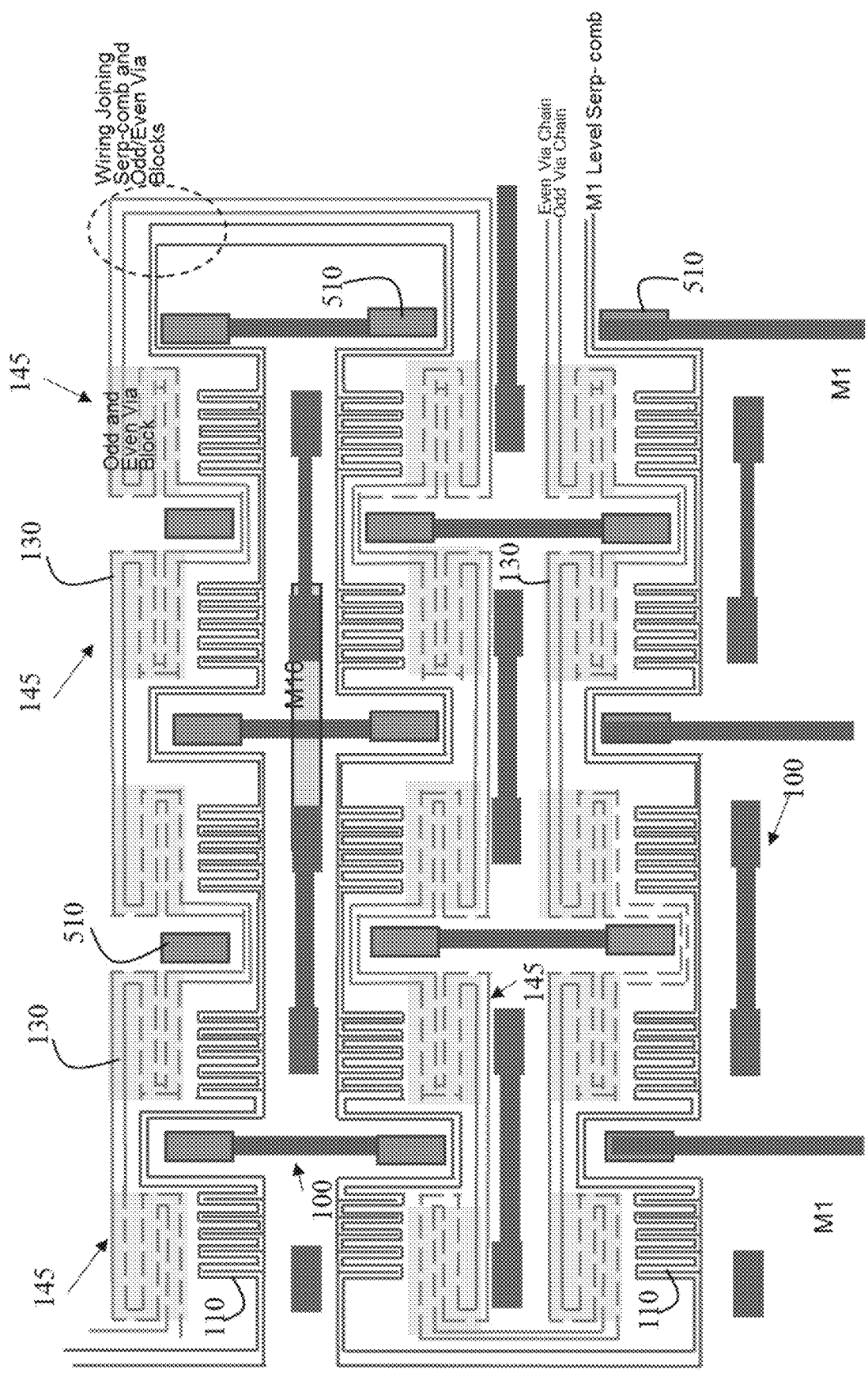
FIG. 7 shows an example plan view of a set of monitoring structures linked with via chains at distinct levels of a corner region of an IC according to various embodiments of the disclosure.

FIG. 7 shows an example plan view of a set of monitoring structures 100 linked with via chains 500 at distinct levels (only M1 level shown) of an IC in a corner region (e.g., corner 80, FIG. 1) of an IC. In this example configuration, accordion via stacks 510 are substantially surrounded by interconnected serpentine-comb structures 130 to form the interconnected monitoring structures 100. Via blocks 520 are interspersed between serpentine-comb structures 130 and via stacks 510. Via chains 145 can be formed with a via set unique to each level of the IC, such that any fail in a via chain 500 identifies the via level in the BEOL 110 containing a crack or defect. A via vertical interconnect level has a substantially larger volume of dielectric compared to a metal level, allowing a larger cross section for cracks to travel. The larger cross-section of dielectric represents a greater probability to fail because there are few in-plane metal features to restrain deformation of the dielectric, like metal in concrete, when load is transferred into the BEOL 110 from the bump or package (e.g., hump features 310, FIG. 6). The monitoring structures 110 are used to measure serp-to-comb electrical leakage through a dielectric under strain loading from the package or bump (e.g., bump features 310, FIG. 6). A crack in the dielectric will pass more current than a dielectric without a crack. Another attribute of the serpentine comb/via chain monitoring structure 110 is that the stiffness of the area in which it is located can be changed by increasing or decreasing the metal width and spacing of the lines 140 and vias 150. This can allow for modification of the strain of the dielectric 155 (FIG. 2) at each metal level, as well as detection of attributes indicative of metal density and CPI integrity.

Figure 8:
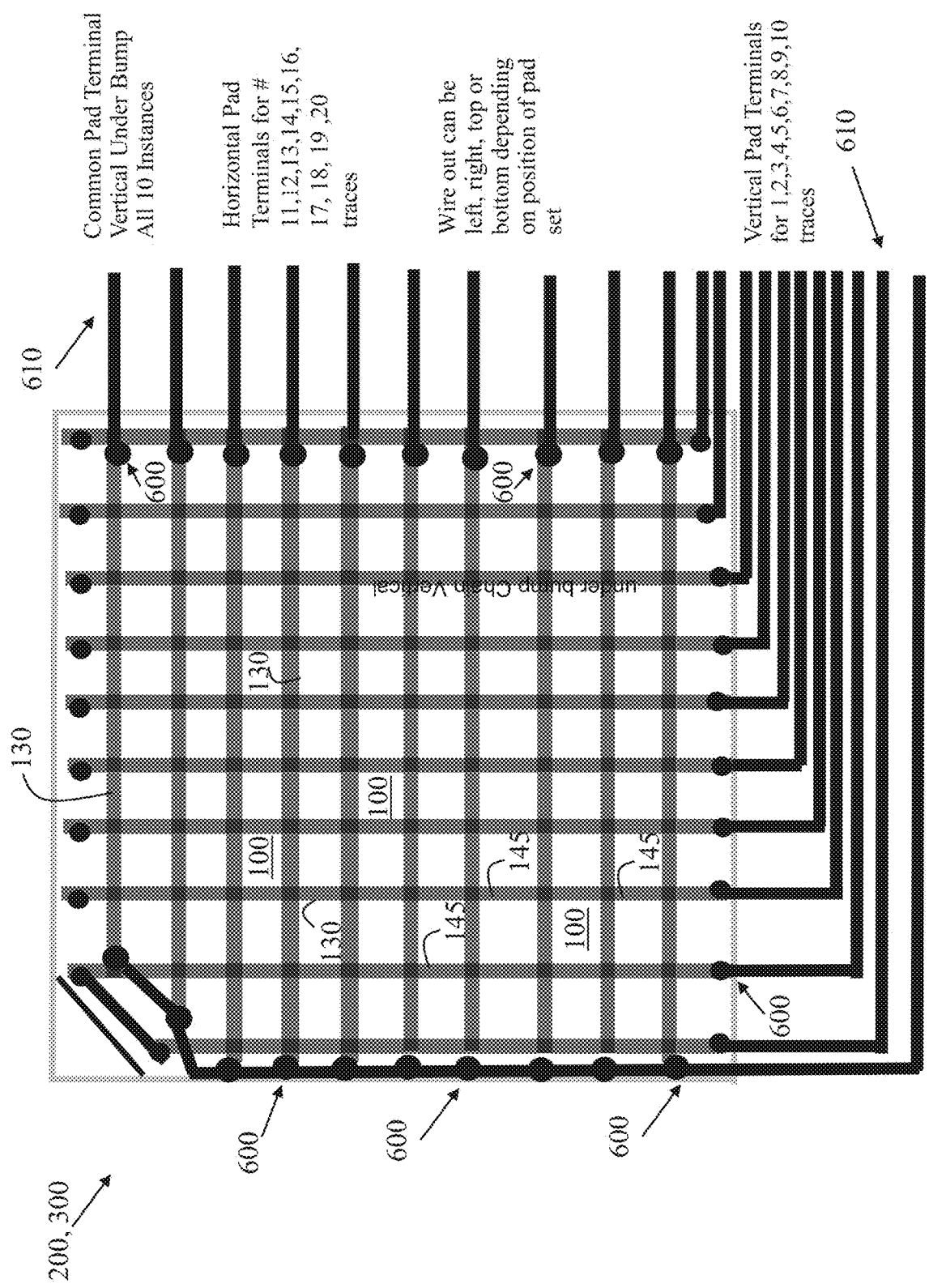
FIG. 8 shows an example plan view of a corner region of an IC, including a plurality of interspersed monitoring structures coupled with pad terminals for CPI testing, according to various embodiments of the disclosure.

FIG. 8 shows an example plan view of a corner region (e.g., corner 80, FIG. 1) of an IC, including a plurality of interspersed monitoring structures 100 coupled with pad terminals 600 for CPI testing according to various embodiments. As shown, serpentine-comb and via chain structures 130, 145 can be interwoven within a given region (e.g., corner 80) to provide contact with a plurality of pad terminals 600 for CPI testing of all levels of an IC within a given region. All levels of testing can be achieved with different pad terminal efficiencies with the most number of terminals used where every serpentine-comb, accordion and via chain at each metal level having a unique input and output terminal. According to various embodiments, the uniform grid provided by the x-oriented and y-oriented accordion vias separates an area into multiple areas. Each area can be constructed with the same metal and via layout, or can include variations. A parameter such as metal density at each metal level can be changed to make variations with different stiffness and dielectric strain (e.g., at dielectric 155, FIG. 2) under loading from the bump or package (e.g., bump features 310, FIG. 5, or pad terminals 600). Due to the grid pattern (e.g., grid 200, or grid 300), the site of each variation can be tracked, and interaction with adjacent areas is more easily tracked in a design of experiments methodology. The via chains adjacent to the serpentine-combs in monitoring structures 100 can be tuned to the desired measurement sensitivity (e.g., measurement current) by controlling the lengths of chains and/or the number of vias 150 (FIG. 2) per vertical connection.

Returning to FIGS. 1 and 2, and with continuing reference to FIGS. 4-8, a method of testing an IC for a CPI failure, performed according to various embodiments, can include:

Process P1: coupling monitoring structure 100 to the IC 20 at a back-end-of-line (BEOL) portion 110. In various embodiments, mounting structure 110 can be coupled to the IC 20 by bonding (e.g., electrically contacting, soldering) monitoring structure 100 to BEOL portion 110, e.g., at circuit structure 120 (FIG. 2). In some cases, BEOL portion 110 includes at least one of a connector bump on IC 20, an underfill material on IC 20 or an oxide layer on IC 20.

Process P2: initiating a test current through IC 20 and monitoring structure 100. In various embodiments, this process can include sending a test current through IC 20, using a conventional current source or IC testing device. In various embodiments, one or more terminal contacts 610 (FIG. 8) can be used to test IC 20 using monitoring structure 100. FIG. 8 shows one example testing configuration according to various embodiments of the disclosure. The current test can be performed according to conventional current testing approaches, such as a back-end-of-line (BEOL) stability indentation (BABSI) test of the IC 20 using monitoring structure 100.

Process P3: measuring the test current at monitoring structure 100. In various embodiments, this process can include using an ammeter or other current testing device to detect the resulting current passing through monitoring structure 100. In particular cases, the current flowing through the serpentine-comb/via chain structure(s) 130, 145 can indicate a potential CPI failure.

Process P4: following measurement of the test current in Process P3, this process can include indicating CPI failure is likely in response to the current measured at monitoring structure 100 deviating from an expected current at the monitoring structure 100. That is, according to various embodiments, an expected current value is stored or otherwise obtained for comparison with the measured current in Process P3. This expected current value can be a range of acceptable current values, and may be specific to the type and/or design of the IC 20. This expected current value can indicate an acceptable amount of current loss based upon the design of IC 20, and measured values which deviate from that expected current value can indicate a potential CPI failure. In some cases, a conventional circuit testing system can be used to compare measurements and indicate a potential CPI failure.

According to various embodiments, monitoring structure 100 can be useful in detecting CPI failure in IC 20. As noted herein, the design of monitoring structure 100, including serpentine-comb/via chain structures 130, 145 with chains of laterally extending wires 140 and corresponding sets of vias 150, can aid in detecting CPI failure in the IC 20. According to various embodiments monitoring structure 100 can be placed in any location in an IC 20 where CPI interactions are of interest. The size of the monitoring structure 100 can be altered by removing sections or alternatively shrinking the size of wires 140 and/or vias 150. In any of these cases, the uniformity of the monitoring structure 100 (or non-uniformity in metal density) is retained, and results can be compared to testing using this structure. In CPI analysis, values of interest are the dielectric strain or strain energy density at the site of failure (e.g., in dielectric 155, FIG. 2). A controlled measurement of this in a laboratory setting is possible using measurement structure 100. The use of BABSI on any of the bump sites (e.g., bump features 310, FIG. 6, or pad terminals 600) can provide an independent measurement of the dielectric strain at failure (e.g., at dielectric 155, FIG. 2), and what levels are most prone to failure. In particular, failure such as cracking can be detected with monitoring device 100, e.g., cracking due to static load on the IC chip, or mechanical or thermal CTE cycling which causes wearout of the dielectric.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A monitoring structure for the testing of an integrated circuit (IC) with a set of metal levels, the monitoring structure comprising:
   a set of serpentine-comb structures configured to connect with the IC at a back-end-of-line (BEOL), wherein each of the serpentine-comb structures is disposed on a corresponding side of the set of metal levels in the IC, each of the serpentine-comb structures including:

a set of wires aligned with and parallel to the set of metal levels in the IC, each wire aligning with the corresponding one of the metal levels; and a set of vias, wherein sub-sets of two distinct vias in the set of vias connect two successive parallel wires aligned with two metal levels of the IC, wherein the set of vias and the set of wires form a chain of interconnected wires, wherein each sub-set of two distinct vias between two successive wires is located proximate to a same end of the two successive wires of the chain of interconnected wires, wherein the chain of interconnected wires is configured to detect a chip package interface (CPI) failure in the IC.

2. The monitoring structure of claim 1, wherein the set of serpentine-comb structures includes a plurality of serpentine comb structures arranged in a grid, the grid sized to contact distinct areas in the BEOL portion of the IC for CPI testing.

3. The monitoring structure of claim 1, wherein the chain of interconnected wires spans levels corresponding to an entirety of the set of metal levels in the IC.

4. The monitoring structure of claim 1, wherein each of the serpentine-comb structures is configured to detect the CPI failure in the IC during a wafer-level test of the IC.

5. The monitoring structure of claim 4, wherein the wafer-level test includes a back-end-of-line (BEOL) stability indentation (BABSI) test, wherein the CPI failure is detected in response to a current flowing through at least one of the set of serpentine-comb structures deviating from an expected current.

6. A method of testing an integrated circuit (IC) with a set of metal levels for a chip package interface (CPI) failure, the method comprising:

coupling a monitoring structure to the IC at a back-end-of-line (BEOL), the monitoring structure having:

a set of serpentine-comb structures configured to connect with the IC at a back-end-of-line (BEOL), wherein each of the serpentine-comb structures is disposed on a corresponding side of the set of metal levels in the IC, each of the serpentine-comb structures including:

a set of wires aligned with and parallel to the set of metal levels in the IC, each wire aligning with the corresponding one of the metal levels; and a set of vias, wherein sub-sets of two distinct vias in the set of vias connect two successive parallel wires aligned with two metal levels of the IC, wherein the set of vias and the set of wires form a chain of interconnected wires, wherein each sub-set of two distinct vias between two successive wires is located proximate to a same end of the two successive wires of the chain of interconnected wires, wherein the chain of interconnected wires is configured to detect the chip package interface (CPI) failure in the IC;

initiating a test current through the IC and the monitoring structure;

measuring the test current at the monitoring structure; and indicating the CPI failure is likely in response to the current measured at the monitoring structure deviating from an expected current at the monitoring structure.

7. The method of claim 6, wherein the chain of interconnected wires and the set of vias are configured to aid in detecting the chip package interface (CPI) failure in the IC.

8. The method of claim 6, wherein the set of serpentine-comb structures includes a plurality of serpentine comb structures arranged in a grid, the grid sized to contact distinct areas in the BEOL portion of the IC during the CPI testing.

9. The method of claim 6, wherein each of the serpentine-comb structures is configured to detect the CPI failure in the IC during the CPI testing.

10. The method of claim 9, wherein the wafer-level test includes a back-end-of-line (BEOL) stability indentation (BABSI) test, wherein the CPI failure is detected in response to a current flowing through at least one of the set of serpentine-comb structures deviating from an expected current.

11. A monitoring structure for the testing an integrated circuit (IC) with a set of metal levels, the monitoring structure comprising:

a plurality of serpentine-comb structures arranged in a grid, each of the serpentine-comb structures configured to configured to connect with the IC at a back-end-of-line (BEOL), wherein each of the serpentine-comb structures is disposed on a corresponding side of the set of metal levels in the IC, each of the serpentine-comb structures including:

a set of wires aligned with and parallel to the set of metal levels in the IC, each wire aligning with the corresponding one of the metal levels; and a set of vias, wherein sub-sets of two distinct vias in the set of vias connect two successive parallel wires aligned with two metal levels of the IC, wherein the set of vias and the set of wires form a chain of interconnected wires, wherein each sub-set of two distinct vias between two successive wires is located proximate to a same end of the two successive wires of the chain of interconnected wires, wherein the chain of interconnected wires is configured to detect a chip package interface (CPI) failure in the IC.

12. The monitoring structure of claim 11, wherein the chain of interconnected wires spans levels corresponding to an entirety of the set of metal levels in the IC.

13. The monitoring structure of claim 11, wherein each of the serpentine-comb structures is configured to detect the CPI failure in the IC during a wafer-level test of the IC.

14. The monitoring structure of claim 13, wherein the wafer-level test includes a back-end-of-line (BEOL) stability indentation (BABSI) test, wherein the CPI failure is detected in response to a current flowing through at least one of the set of serpentine-comb structures deviating from an expected current.

* * * * *